United States Patent [19]

Kaiser, Jr. et al.

[11] Patent Number: 4,953,001
[45] Date of Patent: Aug. 28, 1990

[54] SEMICONDUCTOR DEVICE PACKAGE AND PACKAGING METHOD

[75] Inventors: Joseph A. Kaiser, Jr., Framingham; Bert S. Hewitt, Acton, both of Mass.

[73] Assignee: Raytheon Company, Lexington, Mass.

[21] Appl. No.: 928,706

[22] Filed: Nov. 7, 1986

Related U.S. Application Data

[63] Continuation of Ser. No. 781,315, Sep. 27, 1985, which is a continuation of Ser. No. 432,474, Oct. 4, 1982.

[51] Int. Cl.⁵ .................. H01L 23/12; H01L 23/04
[52] U.S. Cl. ........................... 357/74; 357/77; 357/76
[58] Field of Search ............. 357/74, 77, 76, 68; 333/246

[56] References Cited

U.S. PATENT DOCUMENTS 3,767,979 10/1973 Reber et al. .................. 357/74
3,936,778 2/1976 De Ronde .................... 333/246

FOREIGN PATENT DOCUMENTS 0095343 7/1980 Japan ........................ 357/74
0043357 4/1981 Japan ........................ 357/72

*Primary Examiner*—Rolf Hille
*Assistant Examiner*—S. V. Clark
*Attorney, Agent, or Firm*—Edmund J. Walsh; Richard M. Sharkansky

[57] ABSTRACT

A semiconductor device package is provided to enclose a microstrip transmission line having a ground plane separated from a strip conductor by a dielectric and a semiconductor device having an electrode contact thereof bonded to the strip conductor by a conductive interconnect, such package having a bottom portion and a top portion hermetically sealed together along a conductive surface, such strip conductor being spaced between the conductive surface and the conductive interconnect. A method of packaging a semiconductor device and a microstrip transmission line having a ground plane separated from a strip conductor by a dielectric with such strip conductor bonded to an electrode contact of the semiconductor device, such method comprising the step of hermetically sealing a top portion of the package to a bottom portion of the package along a conductive surface, the strip conductor being between the semiconductor device and the conductive surface. With such arrangement and method the conductive surface providing the hermetic seal between the top and bottom portion of the package after the contact electrode of the semiconductor device has been bonded to the strip conductor of the microstrip transmission line appears as a part of the ground plane conductor to thereby reduce unwanted electrical resonances which would result in a package having a more limited operating bandwidth.

3 Claims, 2 Drawing Sheets

SEMICONDUCTOR DEVICE PACKAGE AND PACKAGING METHOD

This application is a continuation of application Ser. No. 781,315, filed Sept. 27, 1985 which is a continuation of application Ser. No. 432,474, filed Oct. 4, 1982.

BACKGROUND OF THE INVENTION

This invention relates generally to semiconductor device packages and packaging methods and more particularly to microwave field effect transistor (FET) packages and packaging methods.

As is known in the art, it is frequently necessary to provide a hermetically sealed package for a semiconductor device to protect such devices from external environmental effects. When such semiconductor device is to operate at microwave frequencies, as when the device is a microwave field effect transistor, the construction and configuration of the package is sometimes critical in order to minimize any effect of the package on the electrical operation or electrical characteristics of the field effect transistor. One prior art microwave field effect transistor package 10 is shown in FIG. 1 to include a gold plated copper bottom portion 12 having a lower portion 14 providing the base of such bottom portion 12. Integrally formed with the lower portion 14 is middle portion 16. Disposed on and bonded to the right and left upper surface of the middle portion 16 is a pair of strip transmission lines 18, 20 each one having a dielectric substrate 22, 23 with a ground plane conductor 24, 25 on the bottom surface thereof bonded to the upper surface of the middle portion 16 and strip conductors 26, 27 formed on the upper surfaces of the substrates 22, 23. A field effect transistor 28 to be packaged has the source electrode contact 29 thereof formed on the bottom surface of the transistor 28 and bonded to the upper surface of upper portion 30 of bottom portion 12, such upper portion 30 being integrally formed with middle portion 16. The gate electrode and electrode drain contacts 31, 33 are bonded to strip conductors 26, 27 respectively, by electrical interconnects, here conventional wires 34, 35 as shown. The outer upper surface 36 of the outer arms of the lower portion 14 have affixed thereto a ceramic or dielectric slab 40. Sandwiched between the dielectric slab 40 and a second dielectric slab 42 are beam lead conductors 44, 46 which pass through the right and left sidewalls of the bottom portion 12 of the package 10. Layer 55 of gold is plated onto the upper portion 54 of dielectric slab 42. The inner ends of the beam lead conductors 44, 46 are wire bonded to the strip conductors 26, 27 by wires 45, 47 as shown. Thus, the bottom portion 12 of the package 10 is formed as an integral structure made up of the base 14 and the ceramic sidewalls formed by ceramic slabs 40, 42. It is noted that the bottom portion 12 of the package has the ceramic slabs 40, 42 and base 14 bonded together to form a hermetically sealed unit prior to the bonding of the transistor 28 to the strip conductors 26, 27 and the top portion 28. That is the bottom portion 12 of the package is formed using high temperature processing and this high temperature processing would destroy the effectiveness of transistor if it were subjected to such temperatures. Thus, the bottom portion 12 of the package is formed as a unit before the transistor electrodes are bonded as described. Once the bottom portion 12 of the package 10 is formed with the beam lead conductors 44, 46 wire bonded to strip conductors 26, 27 and the field effect transistor 28 wire bonded to strip conductors 26, 27 a ceramic cover 50 having a gold rim 52 bonded to the outer periphery of the ceramic cover 50 is placed on and bonded to the bottom portion 12 of the package 10. More particularly, the upper surface of the ceramic slab 42 is soldered to the gold rim 52 via a layer 54 of solder which is disposed on gold plated layer 55 to thereby hermetically seal the package 10. The use of the solder layer 54 to hermetically seal the gold rim 52 to the gold plated layer 54 allows for the hermteic seal to be performed at a relatively low temperature, such temperature being low enough so that the transistor 28 is not damaged as a result of the hermetic sealing of the top 50 and the bottom 12 after the transistor 28 is bonded to the portion 30 and microstrip transmission lines 18, 20. While such package 10 serves adequately in many microwave applications in other applications such package provides only a limited operating bandwidth.

SUMMARY OF THE INVENTION

A semiconductor device package is provided to enclose a microstrip transmission line having a ground plane separated from a strip conductor by a dielectric and a semiconductor device having an electrode contact thereof bonded to the strip conductor by a conductive interconnect, such package having a bottom portion and a top portion hermetically sealed together along a conductive surface, such strip conductor being spaced between the conductive surface and the conductive interconnect. A method of packaging a semiconductor device and a microstrip transmission line having a ground plane separated from a strip conductor by a dielectric with such strip conductor bonded to an electrode contact of the semiconductor device, such method comprising the step of hermetically sealing a top portion of the package to a bottom portion of the package along a conductive surface, the strip conductor being between the semiconductor device and the conductive surface. With such arrangement and method the conductive surface providing the hermetic seal between the top and bottom portion of the package after the contact electrode of the semiconductor device has been bonded to the strip conductor of the microstrip transmission line appears as a part of the ground plane conductor to thereby reduce unwanted electrical resonances which would result in a package having a more limited operating bandwidth.

BRIEF DESCRIPTION OF THE DRAWINGS

The foregoing and other features of this invention, as well as the invention itself, may be more fully understood from the detailed description read together with the accompanying drawings in which.

DESCRIPTION OF THE PREFERRED EMBODIMENT

Figure 2:
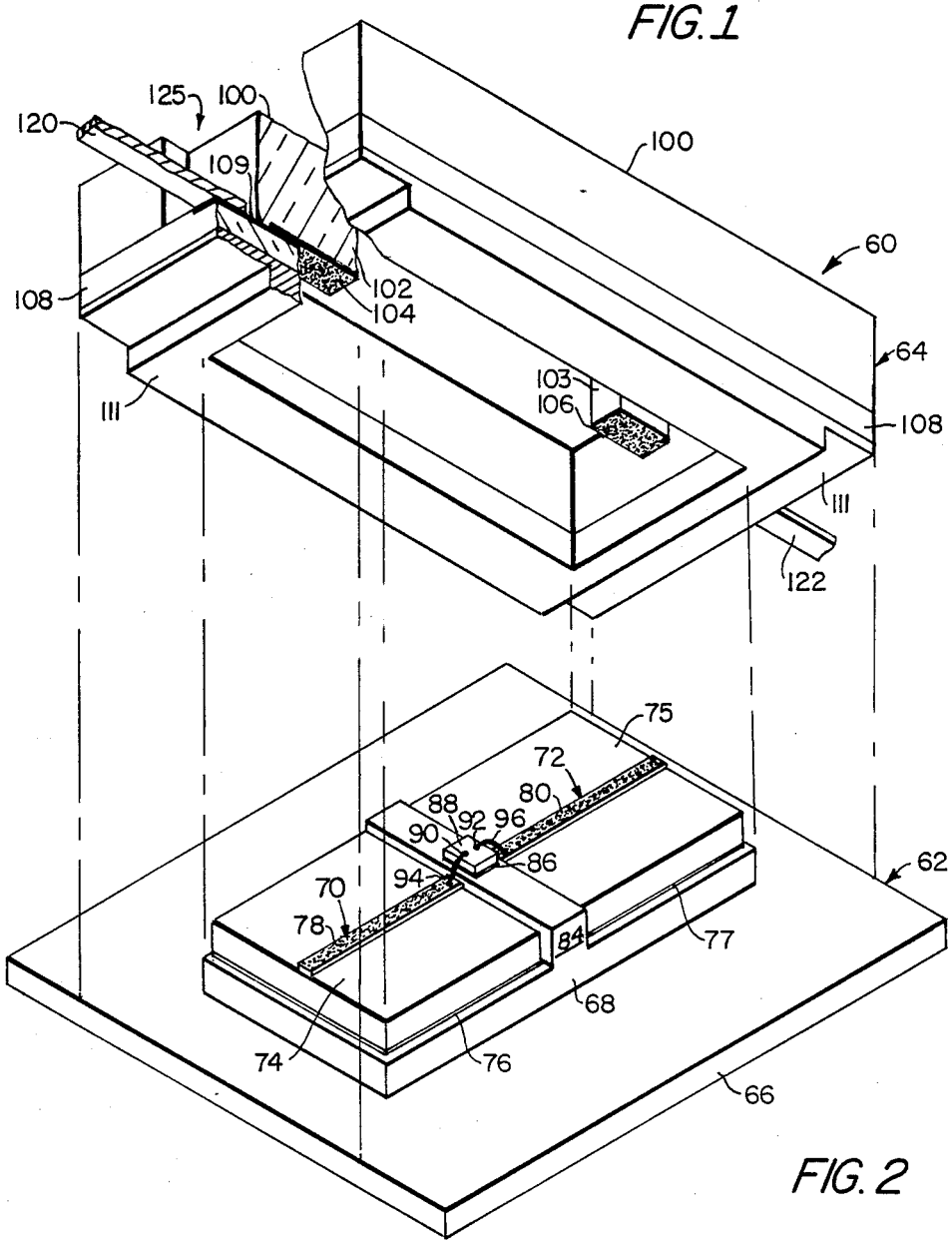
FIG. 2 is an exploded isometric drawing of a microwave field effect transistor package, partially broken away, according to the invention.
Figure 4:
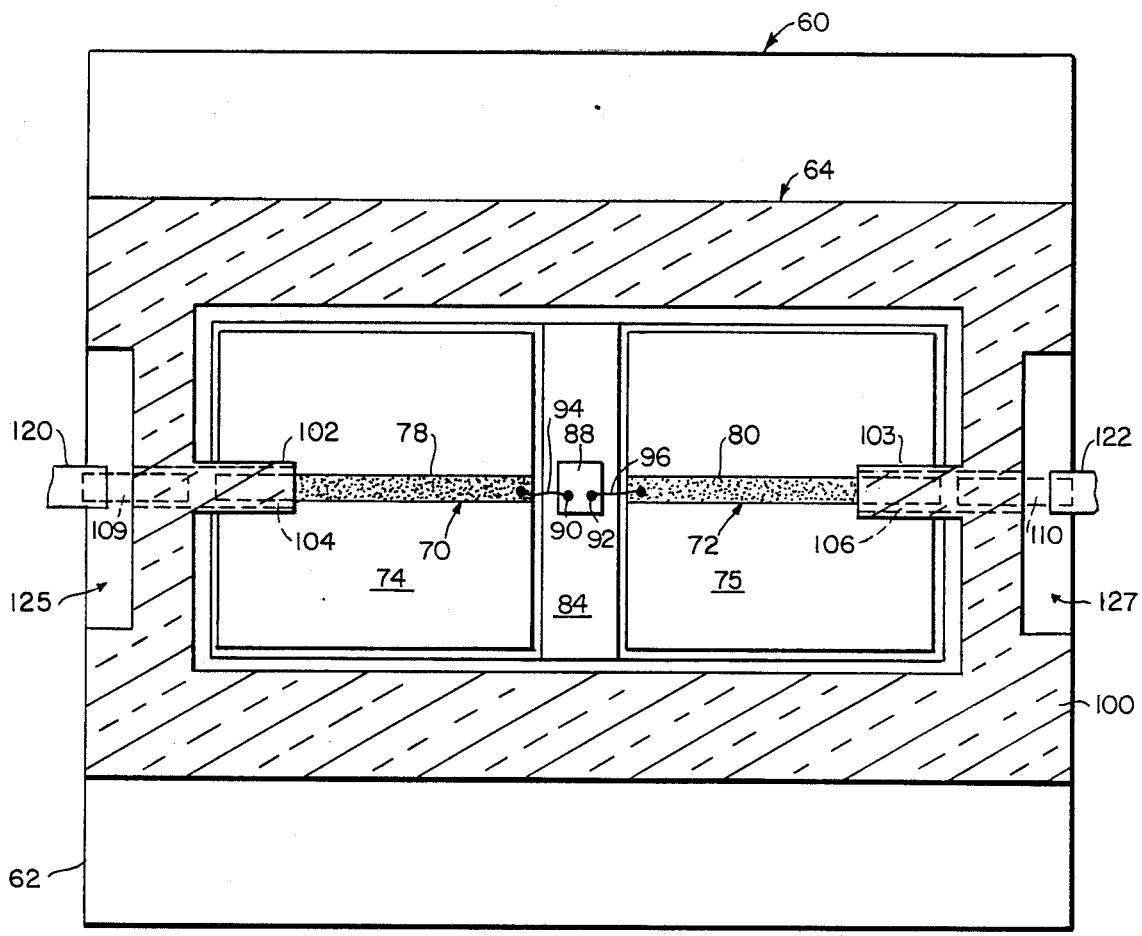
FIG. 4 is a cross-sectional plan view of the field effect transistor package of FIG. 3, such cross-section being taken along line 4—4 in FIG. 3.
Figure 3:
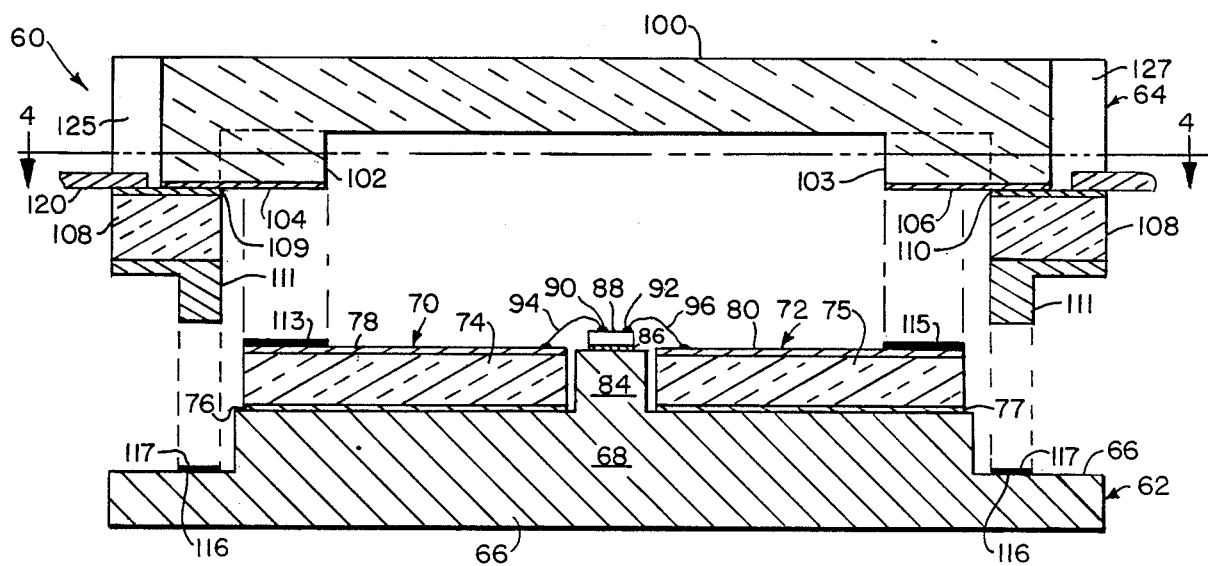
FIG. 3 is an exploded cross-sectional elevational view of the microwave field effect transistor package of FIG. 2.

Referring now to FIGS. 2, 3 and 4, a microwave field effect device package 60 is shown to include a bottom portion 62 and a top portion 64 hermetically sealed to such bottom portion 62. Bottom portion 62 includes a three-tiered gold plated copper base 66. The middle tier 68 has affixed to right and left upper surfaces thereof a pair of microstrip transmission lines 70, 72. Each one of such microstrip transmission lines 70, 72 includes a dielectric substrate 74, 75 with a ground plane conductor 76, 77 disposed on the bottom surfaces thereof and electrically connected to and mechanically bonded to the right and left upper surfaces of the middle tier 68. The upper surfaces of the dielectric substrates 74, 75 have disposed thereon a pair of strip conductors 78, 80. Bonded to the upper surface of the upper centrally disposed portion 84 is the source electrode contact 86 of a field effect transistor 88, such source electrode contact 86 being disposed on the bottom surface of the field effect transistor 88. The drain electrode contact 90 and the gate electrode contact 92 are bonded and electrically connected to strip conductors 78, 80 by conductive interconnects, here conventional conductive wires 94, 96 as shown.

The top portion 64, that is the cover of the package 60, includes a ceramic upper portion 100 having a pair of inwardly extending members 102, 103. Plated on the surfaces of the members 102, 103 of the ceramic upper portion 100 is a pair of gold plated layers 104, 106. A ceramic rim 108 having strips 109, 110 of plated gold is bonded to the lower portion of ceramic portion 100 with the gold layers 104, 106 in contact with strips 109, 110, respectively. Bonded to the lower portion of ceramic rim 108 is a rim 111 of gold as shown. It is noted that the ceramic upper portion 100, ceramic rim 108 and the rim 111 are formed as a hermetically sealed unit using high temperature processes. After having formed the cover 64 and prior to hermetically sealing the top and bottom portions 64, 62 of the package 10, the outer ends of strip conductors 78, 80 have the upper surfaces thereof pre-tinned with layers 113, 115 of solder (FIG. 3). Also, the upper surface 116 of the lower tier or base 66 is also pre-tinned with layer 117 of solder. After pre-tinning the surfaces, the cover 64 is disposed on solder layers 113, 115 on the strip conductors 78, 80 and on solder layer 117. The package 10 is then heated and cooled in a conventional manner to hermetically seal the top portion 64 to the lower portion 62 of the package 60. It is first noted that the hermetic sealing of the gold rim 111 to the bottom portion 66 is done at a relatively low temperature as compared with the temperature needed to form the cover 64 as an integral unit. It is also noted that the hermetic seal takes place along a surface between the gold rim 111 and the surface 116 of lower tier 66 which is separated from the strip conductors 78, 80 by the ground planes 76, 77. That is, to put it another way, the hermetic seal is along a surface 116 which is separated from the drain and gate contact electrodes 90, 92 and the wire conductive interconnects 94, 96 by the strip conductors 78, 80. After hermetically sealing the top portion 64 and the bottom portion 62 of the package 60, beam lead conductors 120, 122 are placed in grooves 125, 127 and are bonded to layers 109, 110 as shown.

Figure 1:
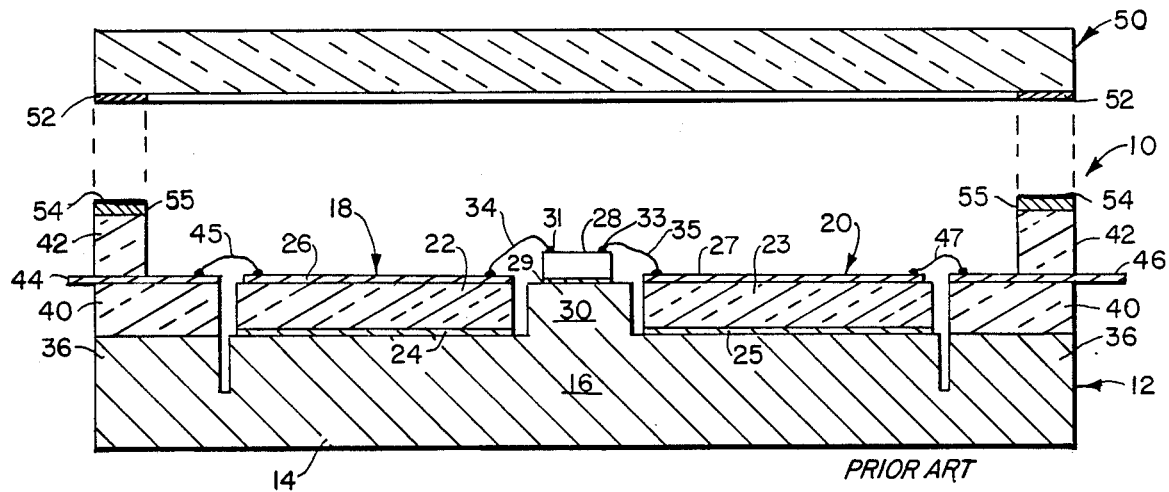
FIG. 1 is an exploded cross-sectional elevational view of a microwave field effect device package according to the prior art.

With the field effect transistor package 10 described in FIG. 1, a resonance has been observed which absorbs radio frequency energy in, for the particular package used, the 7.8 to 8.2 GHZ range. This resonance prevents the package 10 from being used in broad band applications. With the field effect transistor package 60 described in connection with FIGS. 2, 3 and 4, the gold rim 111 is, when soldered to base 66, disposed below the wires 94, 96 so that the conductive sealing surface appears, electrically, as part of the ground plane conductor to reduce electrical interaction between the rim 111 and the wires 94, 96 to thereby substantially eliminate the resonance associated with the package 10 of the prior art described in connection with FIG. 1 and thereby increase the operating bandwidths of the package 60. Having described a preferred embodiment of this invention, it is now evident that other embodiments incorporating these concepts may be used. It is felt, therefore, that this invention should not be restricted to the disclosed embodiment but rather should be limited only by the spirit and scope of the appended claims.

What is claimed is:

1. A semiconductor device package for enclosing: (i) a microstrip transmission line having a lower ground plane conductor separated from an upper strip conductor by a dielectric, and ii a semiconductor device having an electrode contact thereof bonded to the upper strip conductor by a conductive interconnect, such package comprising:

(a) a bottom having disposed thereon the microstrip transmission line and the semiconductor device; and (b) a top hermetically sealed to the bottom along a conductive surface, such conductive surface being disposed below the upper strip conductor and lower ground plane conductor; and wherein the regions of the top disposed above the upper strip conductor are comprised essentially of nonconductive material.

2. A semiconductor device package of claim 1 wherein said conductive surface is electrically connected to the lower ground plane conductor.

3. A semiconductor device package for enclosing: (i) a microstrip transmission line comprising a strip conductor disposed on an upper surface of a dielectric and a ground plane conductor disposed on a lower surface of the dielectric, and (ii) a semiconductor device having an electrode contact thereof coupled to the strip conductor by a conductive interconnect, such package comprising:

(a) a bottom having the microstrip transmission line and the semiconductor device disposed thereon said bottom comprising a conductive mating surface disposed below the upper and lower surfaces of the dielectric; and (b) a cover adapted to form a seal to the bottom portion along the conductive surface wherein, when the cover is sealed to the bottom along the conductive surface, the regions of the cover disposed above the upper strip conductor are comprised essentially of nonconductive material.

* * * * *